(12) United States Patent
Choi et al.

(10) Patent No.: US 11,353,484 B2
(45) Date of Patent: Jun. 7, 2022

(54) CURRENT SENSOR DIAGNOSING APPARATUS AND METHOD

(71) Applicant: LG Chem, Ltd., Seoul (KR)

(72) Inventors: Ho-Deuk Choi, Daejeon (KR); Hwa-Sub Lee, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 17/049,633

(22) PCT Filed: Nov. 1, 2019

(86) PCT No.: PCT/KR2019/014760
§ 371 (c)(1),
(2) Date: Oct. 22, 2020

(87) PCT Pub. No.: WO2020/091534
PCT Pub. Date: May 7, 2020

(65) Prior Publication Data
US 2021/0231713 A1 Jul. 29, 2021

(30) Foreign Application Priority Data
Nov. 2, 2018 (KR) .................. 10-2018-0133910

(51) Int. Cl.
G01R 19/10 (2006.01)
G01R 19/165 (2006.01)
G01R 19/25 (2006.01)

(52) U.S. Cl.
CPC ........... *G01R 19/10* (2013.01); *G01R 19/165* (2013.01); *G01R 19/25* (2013.01)

(58) Field of Classification Search
CPC ...... G01R 19/10; G01R 19/165; G01R 19/25; G01R 31/2829; G01R 35/00; G01R 19/16571; G01R 19/17; G01R 19/2509
(Continued)

(56) References Cited

U.S. PATENT DOCUMENTS 4,077,061 A * 2/1978 Johnston ............. G01R 21/133
702/58
4,719,427 A * 1/1988 Morishita .......... G01R 31/3648
324/427

(Continued)

FOREIGN PATENT DOCUMENTS

EP 2700965 A2 2/2014
JP S63003275 A 1/1988

(Continued)

OTHER PUBLICATIONS

International Search Report for Application No. PCT/KR2019/014760 dated Feb. 25, 2020, 2 pages.

(Continued)

*Primary Examiner* — Tung X Nguyen
*Assistant Examiner* — Robert P Alejnikov, Jr.
(74) *Attorney, Agent, or Firm* — Lerner, David, Littenberg, Krumholz & Mentlik, LLP

(57) ABSTRACT

A current sensor diagnosing apparatus for diagnosing an error of a plurality of current sensors connected to a secondary battery cell. The current sensor diagnosing apparatus may diagnose an error of a current sensor in the same way regardless of the type of a system using the current sensor, the type of a current source, a voltage characteristic, or the like by diagnosing an error of current sensors using offset deviations and current values of two current sensors and may be particularly applied to various systems including a plurality of current sensors.

13 Claims, 4 Drawing Sheets

(58) Field of Classification Search
USPC ........................................................ 324/76.11
See application file for complete search history.

(56) References Cited

U.S. PATENT DOCUMENTS

| | | | |
|---|---|---|---|
| 5,677,611 A | 10/1997 | Yoshihara et al. | |
| 2004/0138836 A1 | 7/2004 | Ishishita et al. | |
| 2009/0230947 A1* | 9/2009 | Sumita | H03K 5/12 324/76.11 |
| 2009/0251103 A1* | 10/2009 | Yamamoto | G01R 19/0084 320/133 |
| 2009/0315519 A1* | 12/2009 | Izumi | H01M 10/482 320/134 |
| 2010/0201320 A1* | 8/2010 | Coe | H01M 10/44 320/129 |
| 2011/0037476 A1 | 2/2011 | Jung et al. | |
| 2011/0181292 A1* | 7/2011 | Oowada | G01R 35/00 324/537 |
| 2011/0270553 A1* | 11/2011 | Ausserlechner | G01R 22/066 702/64 |
| 2012/0283970 A1* | 11/2012 | Boehm | G01R 35/005 702/64 |
| 2016/0124027 A1* | 5/2016 | Sambucco | G01R 19/0092 324/76.11 |
| 2016/0126883 A1 | 5/2016 | Yoo | |
| 2016/0313403 A1* | 10/2016 | Hwang | G01R 35/00 |
| 2017/0003353 A1* | 1/2017 | Seo | G01R 35/04 |
| 2017/0253140 A1* | 9/2017 | Chang | B60L 58/12 |
| 2019/0018046 A1* | 1/2019 | Shimizu | G01R 31/382 |

FOREIGN PATENT DOCUMENTS

| | | |
|---|---|---|
| JP | H09023501 A | 1/1997 |
| JP | 2000206221 A | 7/2000 |
| JP | 2000270484 A | 9/2000 |
| JP | 2002151165 A | 5/2002 |
| JP | 2004191301 A | 7/2004 |
| JP | 2005321251 A | 11/2005 |
| JP | 2007024824 A | 2/2007 |
| JP | 4747705 B2 | 8/2011 |
| JP | 4803161 B2 | 10/2011 |
| JP | 2013019832 A | 1/2013 |
| JP | 2013250078 A | 12/2013 |
| JP | 2014166120 A | 9/2014 |
| JP | 5940840 B2 | 6/2016 |
| JP | 2018021883 A | 2/2018 |
| JP | 2018170846 A | 11/2018 |
| KR | 20100099461 A | 9/2010 |
| KR | 20160052893 A | 5/2016 |
| KR | 101655089 B1 | 9/2016 |
| KR | 20160111166 A | 9/2016 |

OTHER PUBLICATIONS

Zhen C, Chen Z, Huanz D. A novel Sensor Fault Diagnosis method for Lithium-ion Battery System Using Hybrid System Modeling. In2018 Condition Monitoring and Diagnosis (CMD) Sep. 23, 2018 (pp. 1-5). IEEE, [retrieved on Nov. 14, 2018].

Extended European Search Report including Written Opinion for EP19880819.8 dated Jun. 1, 2021; 6 pages.

* cited by examiner

| SECOND CURRENT SENSOR (12b) \ FIRST CURRENT SENSOR (12a) | OFFSET DEVIATION EQUAL TO OR GREATER THAN REFERENCE DEVIATION | OFFSET DEVIATION SMALLER THAN REFERENCE DEVIATION |
|---|---|---|
| OFFSET DEVIATION EQUAL TO OR GREATER THAN REFERENCE DEVIATION | TURN-OFF CONTROL | TURN-OFF CONTROL |
| OFFSET DEVIATION SMALLER THAN REFERENCE DEVIATION | TURN-OFF CONTROL | TURN-ON CONTROL |

CURRENT SENSOR DIAGNOSING APPARATUS AND METHOD

CROSS-REFERENCE TO RELATED APPLICATIONS

The present application is a national phase entry under 35 U.S.C. § 371 of International Application No. PCT/KR2019/014760 filed Nov. 1, 2019, published in Korean, which claims priority from Korean Patent Application No. 10-2018-0133910 filed Nov. 2, 2018, all of which are incorporated herein by reference.

TECHNICAL FIELD

The present application claims priority to Korean Patent Application No. 10-2018-0133910 filed on Nov. 2, 2018 in the Republic of Korea, the disclosures of which are incorporated herein by reference.

The present disclosure relates to a current sensor diagnosing apparatus and method, and more particularly, to a current sensor diagnosing apparatus and method for diagnosing an error of a current sensor by using a relative relationship of two current sensors configured to measure a current value of the same current.

BACKGROUND ART

In general, a current sensor refers to a sensor for detecting a DC current or AC current using a hall sensor or a sensing resistor. Recently, as a secondary battery cell is used more and more not only for mobile devices such as mobile phones and tablet PCs but also for electric vehicles (EVs, HEVs, PHEVs) and large-capacity power storage devices (ESSs), there is an increasing interest and request for a technology for accurately diagnosing whether an error occurs at a current sensor that detects a charging and discharging current of the secondary battery cell.

However, as disclosed in Korean Patent Laid-Open Publication No. 10-2010-0099461, in the conventional techniques, a voltage and a current of a battery pack are measured for a predetermined time, and a voltage change amount and a current change amount are compared with a reference voltage value and a reference current value, respectively, to diagnoses an error of the current sensor. For this reason, it is necessary to use completely different reference values according to the type of a system using the current sensor, the type of a current source, a voltage characteristic, or the like, and thus the conventional techniques may not be easily applied to various systems.

In addition, as disclosed in Japanese Laid-Open Patent Publication No. 1997-023501, in the conventional techniques, it is diagnosed that an error occurs when the output of the current sensor is maintained at 0 for a predetermined time. For this reason, it is only possible to diagnose the error only when the current sensor does not operate at all, and errors when a measurement error occurs in the current value due to a change in the offset of the current sensor, a decrease in response speed, a phase delay, or the like may not be diagnosed.

SUMMARY

Technical Problem

The present disclosure is designed to solve the problems of the related art, and therefore the present disclosure is directed to providing a current sensor diagnosing apparatus and method, which may be applied to diagnose an error of a current sensor in the same way regardless of the type of a system using the current sensor, the type of a current source, a voltage characteristic, or the like and may accurately diagnose errors when a measurement error occurs in the current value due to a change in the offset of the current sensor, a decrease in response speed, a phase delay, or the like.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

An apparatus according to an aspect of the present disclosure is for diagnosing an error of a plurality of current sensors connected to a secondary battery cell, comprising: a control unit configured to for each charging and discharging cycle of the secondary battery cell, receive a first current value measured by a first current sensor and a second current value measured by a second current sensor at a same time point during the charging and discharging cycle, measure a driving offset of the first current sensor whenever the first current sensor measures the first current value, measure a driving offset of the second current sensor whenever the second current sensor measures the second current value, measure a first wake-up offset of the first current sensor and a second wake-up offset of the second current sensor before charging and discharging of the secondary battery cell are performed in a present charging and discharging cycle, compare the first driving offset of the first current sensor and the second driving offset of the second current sensor measured in a previous charging and discharging cycle with the first wake-up offset and the second wake-up offset measured in the present charging and discharging cycle, respectively, and diagnose, based on the comparison result, whether an error occurs in at least one of the first current sensor or the second current sensor.

The control unit may be configured to select a last driving offset of the first current sensor measured in the previous charging and discharging cycle as the first driving offset measured in the previous charging and discharging cycle and select a last driving offset of the second current sensor measured in the previous charging and discharging cycle as the second driving offset measured in the previous charging and discharging cycle.

The current sensor diagnosing apparatus according to another aspect of the present disclosure may further comprise memory configured to store a plurality of driving offsets of the first current sensor and a plurality of driving offsets of the second current sensor according to a measurement order for each charging and discharging cycle.

The control unit may be configured to select a driving offset stored last among the plurality of driving offsets of the first current sensor stored in the storing unit as the first driving offset measured in the previous charging and discharging cycle and select a driving offset stored last among the plurality of driving offsets of the second current sensor stored in the storing unit as the second driving offset measured in the previous charging and discharging cycle.

When it is determined that an error occurs in at least one of the first current sensor and the second current sensor, the control unit may be configured to control an operation state of a main relay connected to the secondary battery cell to an off state so that charging and discharging of the secondary battery cell are not performed in the present charging and discharging cycle.

The control unit may be configured to calculate a first offset deviation between the first driving offset measured in the previous charging and discharging cycle and the first wake-up offset measured in the current charging and discharging cycle, and a second offset deviation between the second driving offset measured in the previous charging and discharging cycle and the second wake-up offset measured in the current charging and discharging cycle and control the operation state of the main relay to the off state when at least one of the calculated first offset deviation or the calculated second offset deviation is equal to or greater than a preset reference deviation.

The control unit may be configured to control the operation state of the main relay to the off state when at least one of the first current value or the second current value is equal to or greater than a preset threshold current.

In the current sensor diagnosing apparatus according to still another aspect of the present disclosure, the control unit may include: a current value sampling unit configured to sample the first current value and the second current value at a same time, at each of a plurality of predetermined sampling time points; a first determining unit configured to determine whether a difference value between the first current value and the second current value sampled at the same timing is greater than a predetermined reference current value; a frequency calculating unit configured to calculate a first frequency by integrating a total number of times at which the difference value is determined not to be greater than the reference current value and calculate a second frequency by integrating a total number of times at which the difference value is determined to be greater than the reference current value; and a second determining unit configured to calculate an error determination ratio corresponding to a ratio of the first frequency to the sum of the first frequency and the second frequency and determine whether an error occurs by comparing the calculated error determination ratio with a predetermined reference ratio.

The second determining unit may be configured to determine that an error does not occur in the first current sensor and the second current sensor when the calculated error determination ratio is equal to or greater than the reference ratio, and determine that an error occurs in at least one of the first current sensor or the second current sensor when the calculated error determination ratio is smaller than the reference ratio.

When the second determining unit determines that an error occurs in at least one of the first current sensor or the second current sensor, the control unit may be configured to control an operation state of a main relay connected to the secondary battery cell to an off state so that charging and discharging of the secondary battery cell are not performed in the present charging and discharging cycle.

The current value sampling unit may be configured to send to the first determining unit a first previous current value and a second previous current value sampled a preset reference amount of time before sending the first current value and the second current value to the first determining unit.

A battery management system according to another aspect of the present disclosure may comprise the current sensor diagnosing apparatus according to any of the embodiments of the present disclosure.

The battery management system according to still another aspect of the present disclosure may further comprise: a SOC (State Of Charge) estimating unit configured to estimate a SOC of the secondary battery cell on the basis of the current values measured through the first current sensor or the second current sensor; and an error information processing unit configured to send a SOC estimation stop request to the SOC estimating unit, in response to a determination by the control unit that an error occurs in at least one of the first current sensor and the second current sensor.

A battery pack according to still another aspect of the present disclosure may comprise the current sensor diagnosing apparatus according to any of the embodiments of the present disclosure.

Advantageous Effects

According to the present disclosure, since an error of two current sensors is diagnosed using offset and current values of the current sensors, it is possible to diagnose an error of the current sensors in the same way regardless of the type of a system using the current sensor, the type of a current source, a voltage characteristic, or the like, and the present disclosure may be easily applied to various systems including a plurality of current sensors.

In addition, since current values measured by two current sensors at the same time are compared with each other to determine whether an error occurs in the current sensors, it is possible to accurately diagnose not only an error when the current sensors do not operate at all but also errors when a measurement error occurs in the current value due to a decrease in response speed of the current sensor, a phase delay, or the like.

Further, it will be obviously understood by those skilled in the art from the following description that various embodiments according to the present disclosure may solve various technical problems not mentioned above.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In the embodiments described below, a secondary battery cell described as a current source of a current sensor generally refers to a secondary battery cell using a current sensor for estimating a state of charge (SOC) or the like.

In addition, in the present disclosure, even though the name of the secondary battery cell is changed according to the type of a positive electrode material, a negative electrode material, an electrolyte or a separator used in the secondary battery cell, the type of a packaging material used to pack the secondary battery, internal and external structures of the secondary battery cell, or the like, all of the corresponding cells may be regarded as the secondary battery cell.

In addition, it should be noted that the present disclosure may be applied not only to diagnose an error of a current sensor for measuring a current of a secondary battery cell but also to diagnose an error of a current sensor a current sensor for a current of a battery pack directly connected to a plurality of secondary battery cells in series to implement a high voltage and a current sensor for measuring a current of an electric motor of a vehicle or a hybrid electric vehicle.

Figures 1, 2:
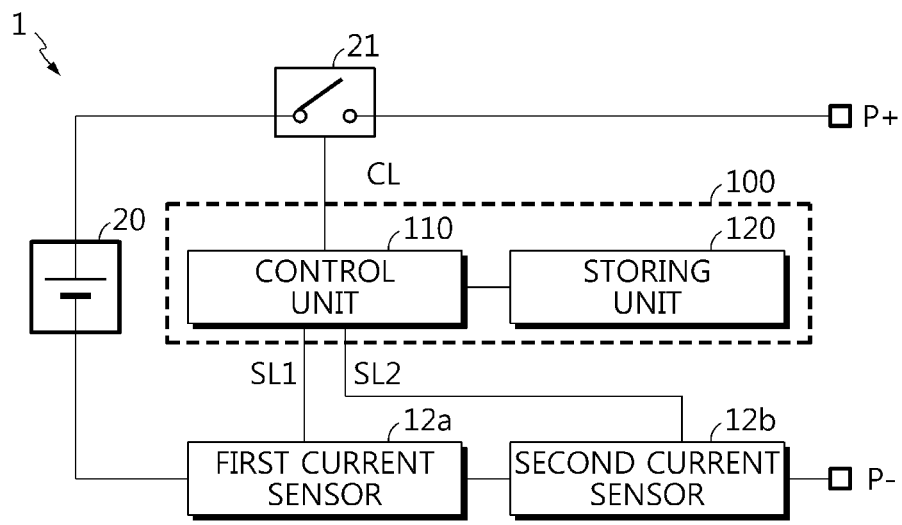
FIG. 1 is a diagram showing an exemplary configuration of a battery pack including a current sensor diagnosing apparatus according to an embodiment of the present disclosure.
FIG. 2 is a diagram showing an operation state of a main relay controlled according to an offset deviation of each of a plurality of current sensors, in the current sensor diagnosing apparatus according to an embodiment of the present disclosure.

FIG. 1 is a diagram showing an exemplary configuration of a battery pack including a current sensor diagnosing apparatus 100 according to an embodiment of the present disclosure.

Referring to FIG. 1, the battery pack may include a secondary battery cell 20, a main relay 21, a first current sensor 12a, a second current sensor 12b, and a current sensor diagnosing apparatus 100.

Here, the first current sensor 12a may be a main sensor, and the second current sensor 12b may be a safety sensor. That is, the first current sensor 12a is a main sensor used to measure a current of the secondary battery cell 20. In addition, the second current sensor 12b is a sensor for measuring a current of the secondary battery cell 20 in parallel with the first current sensor 12a and may be a sensor complementarily provided in addition to the first current sensor 12a.

Here, each of the current sensors 12a, 12b may be configured as a hall sensor or a sensing resistor generally used in the art. The hall sensor or the sensing resistor may be installed on a line through which a charging or discharging current flows. The control unit 110 may measure a voltage signal output from the hall sensor or a voltage applied between both terminals of the sensing resistor and determine a charging current or a discharging current by using the voltage signal or the measured voltage. The control unit 110 may include an analog-to-digital converter (ADC) for converting the voltage signal output from the hall sensor or the voltage applied to both terminals of the sensing resistor into a digital value.

A technique for measuring the charging current or the discharging current of the secondary battery cell 20 using a hall sensor or a sensing resistor is apparent to those skilled in the art and thus a detailed description thereof will be omitted.

The main relay 21 is connected between a positive electrode terminal of the secondary battery cell 20 and a positive electrode terminal P+ of the battery pack to electrically connect a main charging and discharging path or to disconnect the main charging and discharging path. Here, the main charging and discharging path is a path that connects the positive electrode terminal P+ of the battery pack, the main relay 21, the secondary battery cell 20, and the negative electrode terminal P− of the battery pack, and may be a high current path through which a current flows to the battery pack.

In addition, the first current sensor 12a and the second current sensor 12b may be disposed on the main charging and discharging path. Even though the embodiment of FIG. 1 illustrates that both the first current sensor 12a and the second current sensor 12b are disposed between a negative electrode terminal of the secondary battery cell 20 and a negative electrode terminal P− of the battery pack, the first current sensor 12a and the second current sensor 12b may be disposed without limitation on the main charging and discharging path.

The control unit 110 may be configured to receive a first current value measured by the first current sensor 12a and a second current value measured by the second current sensor 12b at the same time point during a charging and discharging cycle of the secondary battery cell 20.

More specifically, each of the current sensors 12a, 12b may measure the magnitude of the charging current or the discharging current of the secondary battery cell 20 at the same timing at regular intervals and output a signal indicating the magnitude of the measured current to the control unit 110.

Referring to FIG. 1, the control unit 110 may be electrically connected to the first current sensor 12a through a first sensing line SL1 and may be electrically connected to the second current sensor 12b through a second sensing line SL2.

For example, the control unit 110 may include a main core and a safety core separately. In addition, the main core may be connected to the first current sensor 12a through the first sensing line SL1, and the safety core may be connected to the second current sensor 12b through the second sensing line SL2.

In addition, the plurality of current sensors 12a, 12b may measure the charging current or the discharging current of the secondary battery cell 20 at regular intervals. That is, the first current sensor 12a may measure the first current value of the secondary battery cell 20, and the second current sensor 12b may measure the second current value of the secondary battery cell 20.

When a current flows through the first current sensor 12a and the second current sensor 12b, the control unit 110 may receive the first current value measured by the first current sensor 12a through the first sensing line SL1 and receive the second current value measured by the second current sensor 12b through the second sensing line SL2.

The control unit 110 may be configured to measure a driving offset of the first current sensor 12a whenever the first current sensor 12a measures the first current value. Here, the offset is a value related to a magnetic flux density of a current sensor which is generally used, and the process for the control unit 110 to measure the offset of the current sensor will not be described in detail.

In addition, the control unit 110 may be configured to measure a driving offset of the second current sensor 12b whenever the second current sensor 12b measures the second current value.

That is, the first current sensor 12a and the second current sensor 12b may measure a current value flowing through the main charging and discharging path at the same time point. Accordingly, the control unit 110 may measure the driving offset of the first current sensor 12a and the driving offset of the second current sensor 12b at the same time point, respectively.

In addition, the control unit 110 may be configured to measure a first wake-up offset of the first current sensor 12a and a second wake-up offset of the second current sensor 12b before the charging and discharging of the secondary battery cell 20 are performed in a present charging and discharging cycle.

Here, the wake-up offset is an offset value of the first current sensor 12a and the second current sensor 12b measured by the control unit 110 when a current does not flow in the main charging and discharging path, unlike the driving offset. That is, when the operation state of the main relay 21 is a turn-off state, the control unit 110 may measure the first wake-up offset of the first current sensor 12a and the second wake-up offset of the second current sensor 12b. To this end, the control unit 110 may be configured to apply a current to the first current sensor 12a and the second current sensor 12b.

For example, the control unit 110 may be configured to include a 5V voltage output terminal, and the first current sensor 12a and the second current sensor 12b may be connected to the voltage output terminal of the control unit 110. In addition, if a current is applied to the first current sensor 12a and the second current sensor 12b by the control unit 110, the control unit 110 may measure the first wake-up offset of the first current sensor 12a and the second wake-up offset of the second current sensor 12b.

The control unit 110 may be configured to compare the first driving offset of the first current sensor 12a and the second driving offset of the second current sensor 12b, measured in a previous charging and discharging cycle, with the first wake-up offset and the second wake-up offset, respectively.

That is, the control unit 110 may compare the wake-up offset measured in the present charging and discharging cycle with the driving offset measured in the previous charging and discharging cycle.

As described above, the wake-up offset is an offset measured on the basis of the current output from the control unit 110 before the charging and discharging of the secondary battery cell 20 are performed, and the driving offset is an offset measured on the basis of the current flowing through the main charging and discharging path. However, since the offset is related to the magnetic flux density of the plurality of current sensors 12a, 12b, the offset may be less affected by the magnitude of the current flowing through the current sensor.

The control unit 110 may be configured to diagnose whether an error occurs in the first current sensor 12a and the second current sensor 12b on the basis of the comparison result.

Specifically, the control unit 110 may maintain the operation state of the main relay 21 to the turn-off state if an offset deviation between the driving offset and the wake-up offset is greater than or equal to a preset deviation for at least one of the first current sensor 12a and the second current sensor 12b. That is, in this case, the control unit 110 may disconnect the main charging and discharging path so that the secondary battery cell 20 is not charged and discharged.

For example, it is assumed that the deviation between the first driving offset and the first wake-up offset of the first current sensor 12a is greater than or equal to the preset deviation. In this case, the difference between the first driving offset measured in the previous charging and discharging cycle and the first wake-up offset measured in the present charging and discharging cycle (in particular, just before charging and discharging of the secondary battery cell 20 starts) may be great. This means that an error has occurred in the first current sensor 12a during at least one of a period when the previous charging and discharging cycle is being performed and a period after the previous charging and discharging cycle ends and before the present charging and discharging cycle starts. Thus, the control unit 110 may diagnose whether an error occurs in the first current sensor on the basis of the deviation between the first driving offset and the first wake-up offset of the first current sensor 12a.

As another example, it is assumed that the deviation between the second driving offset and the second wake-up offset of the second current sensor 12b is greater than or equal to the preset deviation. This case may also be regarded as a case where an error has occurred in the second current sensor 12b during at least one of a period when the previous charging and discharging cycle is being performed and a period before the previous charging and discharging cycle ends and before the present charging and discharging cycle starts. Thus, the control unit 110 may diagnose whether an error occurs in the second current sensor 12b on the basis of the deviation between the second driving offset and the second wake-up offset of the second current sensor 12b.

In addition, if it is determined that an error occurs in at least one of the first current sensor 12a and the second current sensor 12b, the control unit 110 may be configured to control the operation state of the main relay 21 connected to the secondary battery cell 20 into a turn-off state so that charging and discharging of the secondary battery cell 20 are not performed in the present charging and discharging cycle.

Specifically, the first current sensor 12a and the second current sensor 12b may be in a relationship of a main sensor and a safety sensor. That is, in order to improve the stability of the battery pack, the second current sensor 12b may have a complementary nature to the first current sensor 12a. Thus, if it is determined that an error occurs in at least one of the first current sensor 12a and the second current sensor 12b, the control unit 110 may maintain the operation state of the main relay 21 as the turn-off state.

For example, it is assumed that the battery pack 1 shown in FIG. 1 is provided to a device powered from the secondary battery cell 20. In this case, the first current sensor 12a and the second current sensor 12b may measure a current flowing through the main charging and discharging path, and the control unit 110 may always diagnose a state of the battery pack on the basis of the current values measured by the first current sensor 12a and the second current sensor 12b. That is, the device (for example, an electric vehicle) powered from the secondary battery cell 20 has a risk of causing a big accident according to the state of the battery pack and the secondary battery cell 20. Thus, if it is determined that an error occurs in the second current sensor 12*b* having a subsidiary/complementary nature, the control unit 110 may control the main relay 21 to disconnect the main charging and discharging path in order to secure the stability of the battery pack.

In the embodiment of FIG. 1, control unit 110 may be connected to the main relay 21 through a control line CL. In addition, the control unit 110 may control the operation state of the main relay 21 by outputting a turn-off command signal or a turn-on command signal through the control line CL.

For example, if the control unit 110 outputs the turn-off command signal through the control line CL, the main relay 21 may receive the corresponding signal and the operation state may be switched into or maintained in the turn-off state. That is, in this case, the main charging and discharging path may be disconnected.

As another example, if the control unit 110 outputs the turn-on command signal through the control line CL, the main relay 21 may receive the corresponding signal and the operation state may be switched into or maintained in the turn-on state. That is, in this case, the main charging and discharging path may be electrically connected.

The operation state of the main relay 21 controlled by the control unit 110 will be described in detail on the basis of the offset deviation of the first current sensor 12*a* and the offset deviation of the second current sensor 12*b* with reference to FIG. 2.

FIG. 2 is a diagram showing an operation state of a main relay 21 controlled according to an offset deviation of each of a plurality of current sensors, in the current sensor diagnosing apparatus 100 according to an embodiment of the present disclosure.

Referring to FIG. 2, the offset deviation refers to a deviation between the driving offset and the wake-up offset. That is, the offset deviation of the first current sensor 12*a* refers to a deviation between the first driving offset and the first wake-up offset of the first current sensor 12*a*. More specifically, the offset deviation of the first current sensor 12*a* refers to a deviation between the first driving offset measured in the previous charging and discharging cycle and the first wake-up offset measured in the present charging and discharging cycle (before a current flows in the main charging and discharging path).

Similarly, the offset deviation of the second current sensor 12*b* refers to a deviation between the second driving offset and the second wake-up offset of the second current sensor 12*b*.

In addition, a reference deviation refers to a preset reference deviation, which is a reference value for determining whether an error occurs in the plurality of current sensors 12*a*, 12*b*. That is, if the offset deviation of any one current sensor is greater than or equal to the reference deviation, the control unit 110 may determine that an error has occurred in the current sensor. That is, if the offset deviation is greater than or equal to the reference deviation, the magnetic flux density of the current sensor is greatly changed, which may mean that an error occurs in the current sensor.

First, the control unit 110 may be configured to calculate a first offset deviation between the first driving offset and the first wake-up offset and a second offset deviation between the second driving offset and the second wake-up offset.

In addition, if at least one of the calculated first offset deviation and the calculated second offset deviation is greater than or equal to a preset reference deviation, the control unit 110 may be configured to control the operation state of the main relay 21 into a turn-off state.

Referring to FIG. 2, only when both the first offset deviation and the second offset deviation are smaller than the preset reference deviation, the control unit 110 may control the operation state of the main relay 21 into a turn-on state so that the main charging and discharging path is electrically connected to perform the present charging and discharging cycle.

In contrast, if any one of the first offset deviation and the second offset deviation is equal to or greater than the preset reference deviation, the control unit 110 may control the operation state of the main relay 21 into a turn-off state so that the main charging and discharging path is disconnected not to perform the present charging and discharging cycle any more.

That is, in the current sensor diagnosing apparatus 100 according to an embodiment of the present disclosure, in order to accurately measure and safely control the current flowing through the secondary battery cell 20, charging or discharging of the secondary battery cell 20 is performed only when both the first current sensor 12*a* serving as a main sensor and the second current sensor 12*b* serving as a safety sensor are in a normal state.

Thus, since charging and discharging of the secondary battery cell 20 are performed only when the first current sensor 12*a* and the second current sensor 12*b* are in a normal state, the reliability of the measured current value for the secondary battery cell 20 may be increased. In addition, an accident caused by an incorrect current measurement for the secondary battery cell 20 may be prevented in advance.

The control unit 110 may be configured to select a driving offset of the first current sensor 12*a* measured last in the previous charging and discharging cycle as the first driving offset.

Preferably, when calculating the first offset deviation of the first current sensor 12*a*, the control unit 110 may calculate a deviation between the first driving offset and the first wake-up offset measured at the nearest time point.

That is, since the control unit 110 measures the first driving offset whenever the first current sensor 12*a* measures the first current value in the charging and discharging cycle, the control unit 110 may diagnose the most recent state of the first current sensor 12*a* by calculating a deviation between the first driving offset and the first wake-up offset measured at the nearest time point. To this end, the control unit 110 may select a driving offset of the first current sensor 12*a* measured last in the previous charging and discharging cycle, namely a driving offset of the first current sensor 12*a* measured most recently in the previous charging and discharging cycle, as the first driving offset used to calculate the first offset deviation.

Similarly, the control unit 110 may be configured to select a driving offset of the second current sensor 12*b* measured last in the previous charging and discharging cycle as the second driving offset.

The control unit 110 may measure the second driving offset whenever the second current sensor 12*b* measures the second current value in the charging and discharging cycle. Thus, the control unit 110 may select a driving offset of the second current sensor 12*b* measured most recently in the previous charging and discharging cycle as the second driving offset used to calculate the second offset deviation.

Thus, the current sensor diagnosing apparatus 100 according to an embodiment of the present disclosure may determine whether an error occurs at the plurality of current sensors 12*a*, 12*b* by diagnosing the most recent state of the plurality of current sensors 12*a*, 12*b*.

The according current sensor diagnosing apparatus 100 according to an embodiment of the present disclosure may further include a storing unit 120 for storing a plurality of driving offsets of the first current sensor 12a and a plurality of driving offsets of the second current sensor 12b in a measurement order for each of the charging and discharging cycles.

The storing unit 120 receives and stores the determination result of the control unit 110 or the like. The storing unit 120 is not particularly limited as long as it is a storage medium capable of recording and erasing information. For example, the storing unit 120 may be a RAM, a ROM, an electrically erasable programmable read-only memory (EEPROM), a register, a flash memory, a hard disk, an optical recording medium, or a magnetic recording medium.

In addition, the storing unit 120 may be electrically connected to the control unit 110 through, for example, a data bus, so as to be accessed by the control unit 110. Through this connection, the storing unit 120 may store and/or update and/or erase and/or send data generated when a program including various control logics performed by the control unit 110 and/or a control logic is executed. The storing unit 120 may be logically divided into two or more parts, some or all of which may be included in the control unit 110.

For example, referring to FIG. 1, the storing unit 120 may be connected to the control unit 110. The storing unit 120 and the control unit 110 may be connected to each other to send and receive signals through a wired line or wireless communication. Preferably, the storing unit 120 and the control unit 110 may be connected to each other through a wired line to minimize external interference.

The control unit 110 may send the plurality of driving offsets of the first current sensor 12a and the plurality of driving offsets of the second current sensor 12b measured in the charging and discharging cycle to the storing unit 120. The storing unit 120 may store the plurality of driving offsets of the first current sensor 12a and the plurality of driving offsets of the second current sensor 12b received from the control unit 110. Preferably, the storing unit 120 may store the plurality of received driving offsets of the first current sensor 12a and the plurality of received driving offsets of the second current sensor 12b for each charging and discharging cycle.

For example, the storing unit 120 may store the plurality of driving offsets of the first current sensor 12a and the plurality of driving offsets of the second current sensor 12b separately for the first charging and discharging cycle, the second charging and discharging cycle and the $N^{th}$ charging and discharging cycle, respectively. Thus, the control unit 110 may selectively refer to only the plurality of driving offsets of the first current sensor 12a and the plurality of driving offsets of the second current sensor 12b stored in the storing unit 120 for a desired charging and discharging cycle.

The control unit 110 may be configured to select a driving offset stored last among the plurality of driving offsets of the first current sensor 12a stored in the storing unit 120 as the first driving offset and select a driving offset stored last among plurality of driving offsets of the second current sensor 12b stored in the storing unit 120 as the second driving offset.

Preferably, the control unit 110 may send the plurality of measured driving offsets of the first current sensor 12a and the plurality of measured driving offsets of the second current sensor 12b to the storing unit 120 according to a measurement order.

For example, the control unit 110 may send a plurality of driving offsets of the first current sensor 12a and a plurality of driving offsets of the second current sensor 12b measured at a first time point to the storing unit 120, and then send a plurality of driving offsets of the first current sensor 12a and a plurality of driving offsets of the second current sensor 12b measured at a second time point to the storing unit 120. In addition, the storing unit 120 may store the plurality of driving offsets of the first current sensor 12a and the plurality of driving offsets of the second current sensor 12b in the order of receiving the plurality of driving offsets.

Thus, the control unit 110 may select a driving offset of the first current sensor 12a measured most recently in the previous cycle by selecting the plurality of driving offsets of the first current sensor 12a stored last in the storing unit 120. In addition, the control unit 110 may select a driving offset of the second current sensor 12b measured most recently in the previous cycle by selecting the plurality of driving offsets of the second current sensor 12b stored last in the storing unit 120.

In addition, the control unit 110 may select the driving offset of the first current sensor 12a measured most recently in the previous charging and discharging cycle as the first driving offset and diagnose a recent state of the first current sensor 12a on the basis of a deviation between the selected first driving offset and the first wake-up offset measured in the present charging and discharging cycle.

Similarly, the control unit 110 may select the driving offset of the second current sensor 12b measured most recently in the previous charging and discharging cycle as the second driving offset and diagnose a recent state of the second current sensor 12b on the basis of a deviation between the selected second driving offset and the second wake-up offset measured in the present charging and discharging cycle.

Thus, the current sensor diagnosing apparatus 100 according to an embodiment of the present disclosure diagnoses the latest state of the first current sensor 12a and the second current sensor 12b whenever a new charging and discharging cycle is performed, thereby preventing an unexpected accident caused by an error occurring in the current sensors.

If a charging and discharging cycle is in progress (charging and/or discharging is already being performed), even if an error occurs in the current sensor, the main charging and discharging path may not be disconnected immediately. For example, in the case where the battery pack 1 shown in the embodiment of FIG. 1 is provided to a device such as an electric vehicle, if the main charging and discharging path is disconnected while the charging and discharging cycle is being performed, the electric vehicle may turn off immediately. Thus, in order to solve this problem, the current sensor diagnosing apparatus 100 diagnoses whether an error occurs in the plurality of current sensors 12a, 12b when the device using the secondary battery cell 20 starts driving (before charging and discharging of the secondary battery cell 20 are initiated).

The control unit 110 may be configured to control the operation state of the main relay 21 into a turn-off state if at least one of the first current value and the second current value is greater than or equal to a preset threshold current.

Specifically, the control unit 110 may determine that an overcurrent flows in the battery pack if any one of the first current value measured by the first current sensor 12a and the second current value measured by the second current sensor 12b is greater than or equal to the preset threshold current.

The control unit 110 may block the current flowing in the main charging and discharging path by controlling the operation state of the main relay 21 into a turn-off state in order to prevent internal components of the battery pack from being damaged by overcurrent.

That is, the control unit 110 may control the operation state of the main relay 21 by diagnosing whether an error occurs in the plurality of current sensors 12a, 12b on the basis of the offset deviation of the plurality of current sensors 12a, 12b at a time point when the secondary battery cell 20 starts to operate, and may control the operation state of the main relay 21 on the basis of the current values measured by the plurality of current sensors 12a, 12b at a time point when the secondary battery cell 20 is in operation.

Figure 3:
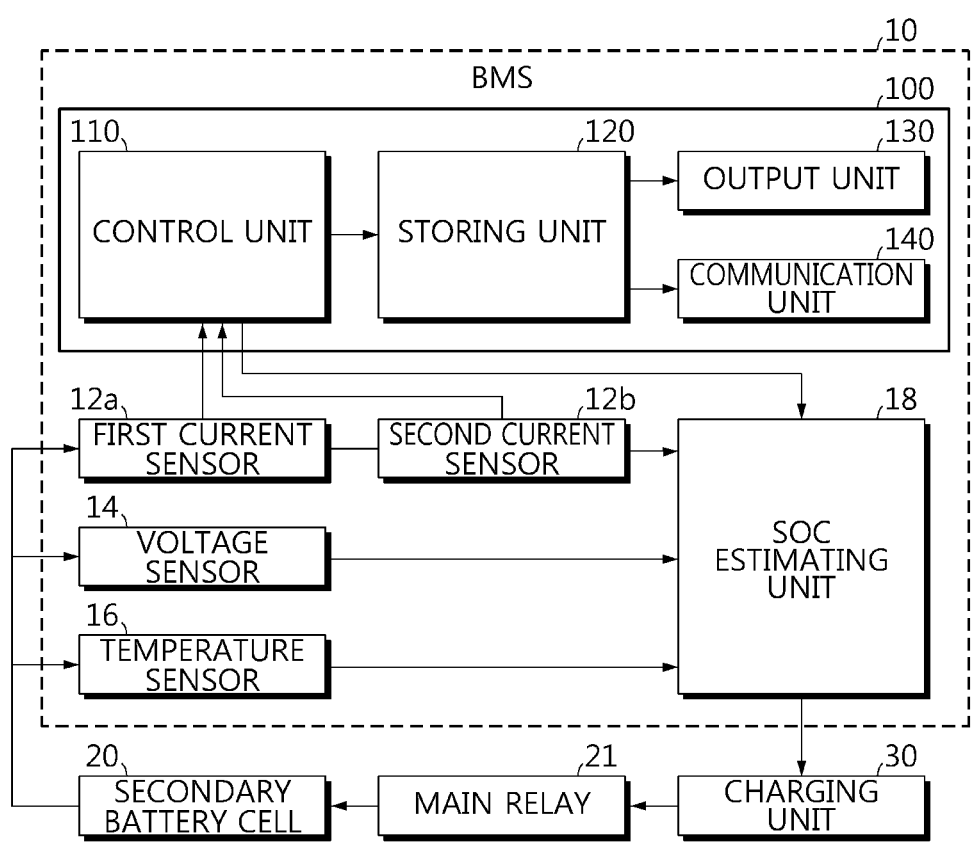
FIG. 3 is a block diagram schematically showing the current sensor diagnosing apparatus according to an embodiment of the present disclosure.

FIG. 3 is a block diagram schematically showing a battery management system (BMS) including the current sensor diagnosing apparatus 100 according to an embodiment of the present disclosure.

Referring to FIG. 3, the current sensor diagnosing apparatus 100 according to the present disclosure is an apparatus for diagnosing whether an error occurs in at least one of the plurality of current sensors 12a, 12b configured to measure the same current and may be configured as a device included in a battery management system (BMS) 10. Here, the same current refers to a current flowing through the secondary battery cell at the same time point.

Depending on an embodiment, the current sensor diagnosing apparatus 100 may also be configured as a separate device that works in association with the BMS 10. In this case, the current sensor diagnosing apparatus 100 may be connected to the BMS 10 through a communication interface or an I/O interface and may send error diagnosis information of the current sensor to the BMS 10.

The BMS 10 may periodically measure and monitor charging and discharging current, voltage, and temperature of the secondary battery cell 20 and estimate an SOC of the secondary battery cell 20. In addition, the BMS 10 is a battery management system that performs overall management for the secondary battery cell 20, such as charging the secondary battery cell 20 through the charging unit 30 according to the estimation result. To this end, the BMS 10 may include a plurality of current sensors 12a, 12b, a voltage sensor 14a, a temperature sensor 16, an SOC estimating unit 18, and the like.

The plurality of current sensors 12a, 12b are configured to measure the same current.

For example, as in the embodiment of FIG. 1, a series circuit connecting the plurality of current sensors 12a, 12b in series with each other may be configured to be connected in series on a line through which the charging and discharging current of the secondary battery cell 20 flows.

As another example, if the plurality of current sensors 12a, 12b are all designed to have the same equivalent resistance, a parallel circuit connecting the plurality of current sensors 12a, 12b in parallel to each other may also be configured to be connected in series on a line through which the charging and discharging current of the secondary battery cell 20 flows.

A current measuring time point of the plurality of current sensors 12a, 12b may be controlled by the SOC estimating unit 18 during the SOC estimating process and may also be controlled by the control unit 110 of the current sensor diagnosing apparatus 100 during the current sensor diagnosing process. As will be described again below, the control unit 110 of the current sensor diagnosing apparatus 100 may be configured to include the SOC estimating unit 18.

In the current sensor diagnosing process, if the current measuring time point of the plurality of current sensors 12a, 12b is controlled by the control unit 110, the current sensors 12a, 12b may be electrically coupled to the control unit 110 through a conductive line to send and receive electric signals. For example, in the embodiment of FIG. 1, the first current sensor 12a may be connected to the control unit 110 through the first sensing line SL1, and the second current sensor 12b may be connected to the control unit 110 through the second sensing line SL2.

The BMS 10 may determine an average value of the current values measured through the plurality of current sensors 12a, 12b as a measured current value, and at the same time, an error in the current sensors 12a, 12b may be reliably diagnosed.

Meanwhile, the voltage sensor 14 and the temperature sensor 16 refer to a sensor mainly used for estimating an SOC or, in other cases, used for managing the secondary battery cell 20.

The voltage sensor 14 measures a voltage of the secondary battery cell 20. To this end, voltage sensor 14 is electrically coupled with the SOC estimating unit 18 to send and receive electric signals. The voltage sensor 14 may measure the voltage applied between the positive electrode and the negative electrode of the secondary battery cell 20 at regular intervals under the control of the SOC estimating unit 18 and output a signal indicating the magnitude of the measured voltage to the SOC estimating unit 18. The SOC estimating unit 18 may determine the voltage according to the signal output from the voltage sensor 14 and store the determined voltage value in itself or in the storing unit 120 of the BMS 10.

The voltage sensor 14 may be configured using a voltage measuring circuit generally used in the art. For example, the voltage measuring circuit may include a differential amplifier. The circuit configuration of the voltage sensor 14 for measuring the voltage of the secondary battery cell is obvious to those skilled in the art and thus will not be described in detail.

The temperature sensor 16 measures a temperature of the secondary battery cell 20. The temperature measurement time point is controlled by SOC estimating unit 18. To this end, the temperature sensor 16 is electrically coupled with the SOC estimating unit 18 to send and receive electric signals. The temperature sensor 16 may repeatedly measure the temperature of the secondary battery cell 20 at regular intervals under the control of the SOC estimating unit 18 and output a signal indicating the measured temperature to the SOC estimating unit 18. The SOC estimating unit 18 may determine the temperature of the secondary battery cell 20 according to the signal output from the temperature sensor 16 and store the determined temperature value in itself or in the storing unit 120 of the BMS 10.

The temperature sensor 16 may be configured using a thermocouple commonly used in the art. The circuit configuration of the temperature sensor 16 for measuring the temperature of the secondary battery cell is obvious to those skilled in the art and thus will not be described in detail.

The SOC estimating unit 18 performs SOC estimation on the secondary battery cell 20. The SOC estimating unit 18 may measure the SOC of the secondary battery cell 20 by integrating the charging current or the discharging current of the secondary battery cell 20 stored in itself or in the storage unit 120 of the BMS 10 while the secondary battery cell 20 is being charged or discharged.

In general, an initial value of the SOC may be determined by measuring an open circuit voltage of the secondary battery cell 20 before charging or discharging of the secondary battery cell is initiated and referring to a look-up table that defines the SOC for each open circuit voltage.

Depending on an embodiment, the SOC estimating unit 18 may calculate the SOC of the secondary battery cell 20 by using an extended Kalman filter. The extended Kalman filter refers to a mathematical algorithm for adaptively estimating an SOC of a secondary battery cell using voltage, current and temperature of the secondary battery cell. SOC estimation using the extended Kalman filter may refer to, for example, the paper of Gregory L. Plett "Extended Kalman filtering for battery management systems of LiPB-based HEV battery packs Parts 1, 2 and 3" (Journal of Power Source 134, 2004, 252-261), which may be incorporated as a part of this specification.

In addition to the extended Kalman filter, the SOC of the secondary battery cell 20 may be determined by other well-known methods for estimating an SOC by selectively utilizing voltage, temperature and current of the secondary battery cell 20. For example, the SOC estimating unit 18 may estimate the SOC of the secondary battery cell 20 by using a current integration method that integrates measured current values of the secondary battery cell 20.

The calculated SOC value may be stored in the SOC estimating unit 18 or in the storing unit 120 included in the BMS 10.

The charging unit 30 may control overall charging and discharging of the secondary battery cell 20 with reference to the SOC value stored in the SOC estimating unit 18 or the storing unit 120 of the BMS 10. For example, the charging unit 30 may control the charging output or the discharging output of the secondary battery cell 20 with reference to a look-up table that defines an output according to the SOC. In addition, the charging unit 30 may stop charging if the SOC of the secondary battery cell 20 reaches 100%, and stop discharging if the SOC reaches 0%. Of course, the SOC % at which charging and discharging ends may be set to be lower than 100% and higher than 0%. The look-up table may be stored in advance in the SOC estimating unit 18 or the storing unit 120 included in the BMS 10.

FIG. 3 does not show a current source for supplying a charging current to the secondary battery cell 20 and a load for supplying a discharging current of the secondary battery cell 20.

The current source may be a utility power or a regenerative charging device combined with a generator or brake coupled with an engine of an electric vehicle or a hybrid electric vehicle. The load is a device that consumes a discharging power of the secondary battery cell 20 and may be a power conversion circuit such as a two-way inverter that is coupled to a motor of a vehicle or supplies a power required by various electronic devices.

In an embodiment, the SOC estimating unit 18 described above may be integrated with the control unit 110 of the current sensor diagnosing apparatus 100. That is, the control unit 110 may perform the function of the SOC estimating unit 18 described above.

Meanwhile, the current sensor diagnosing apparatus 100 according to an embodiment of the present disclosure includes the control unit 110 and the storing unit 120, and may further include an output unit 130, a communication unit 140, and the like depending on an embodiment.

The control unit 110 periodically receives current values of the first current sensor 12*a* and the second current sensor 12*b* configured to measure a current value of the same current and determines whether an error occurs in the first current sensor 12*a* and the second current sensor 12*b* by using the received current values.

The output unit 130 outputs visual information according to the control signal of the control unit 110. The output unit 130 may be electrically connected to the control unit 110 to receive the control signal of the control unit 110. The output unit 130 is not particularly limited as long as it may output visual information. For example, the output unit 130 may be configured using a light emitting diode (LED) for outputting an optical signal or a display unit for displaying an image such as a liquid crystal display (LCD), an organic light emitting diode (OLED) and an active matrix organic light emitting diode (AMOLED).

The communication unit 140 performs wired or wireless communication with an external communication device according to the control signal of the control unit 110. The communication unit 140 may be electrically connected to the control unit 110 to receive the control signal and transmission data of the control unit 110 and send the same to the external communication device or to transmit data received from the external communication device to the control unit 110. The communication unit 140 is not particularly limited as long as it may perform data communication with the external communication device.

The communication unit 140 may be configured to include a communication port and a communication interface to which a communication cable terminal of the external communication device is connected. In addition, the communication unit 140 may include a near field communication (NFC) communication module or a radio frequency identification (RFID) communication module to send the data of the control unit 110 or the storing unit 120 to the external communication device by a tag method or may include a Bluetooth communication module, a WiFi communication module or a ZigBee communication module to perform wireless data communication with peripheral communication devices.

As mentioned above, the control unit 110 periodically receives the current values of the first current sensor 12*a* and the second current sensor 12*b* configured to measure a current value of the same current and determines whether an error occurs in the first current sensor 12*a* and the second current sensor 12*b* by using the received current values.

Figure 4:
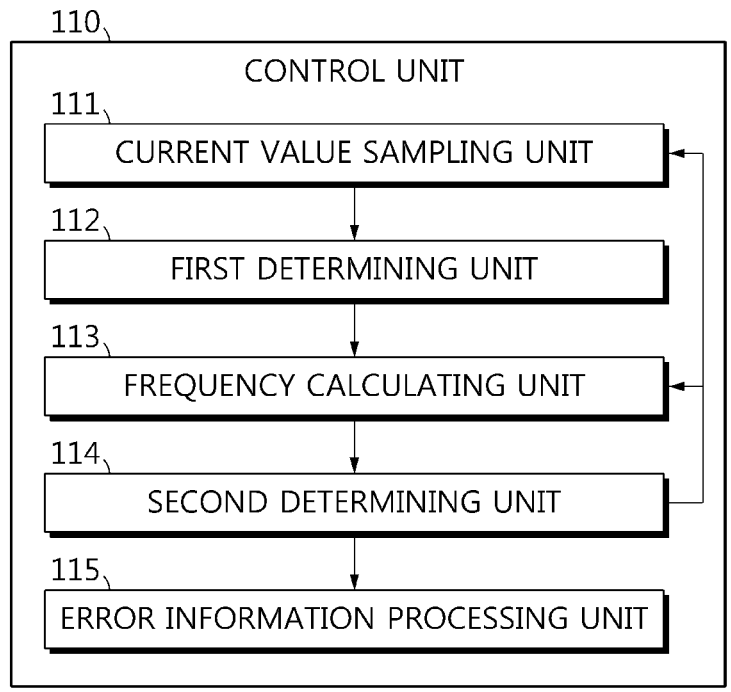
FIG. 4 is a block diagram schematically showing a control unit, in the current sensor diagnosing apparatus according to an embodiment of the present disclosure.

FIG. 4 is a block diagram showing an example of the control unit 110 applied to the present disclosure.

Referring to FIG. 4, the control unit 110 may include a current value sampling unit 111, a first determining unit 112, a frequency calculating unit 113, and a second determining unit 114, and may further include an error information processing unit 115 depending on an embodiment.

The components shown in FIG. 4 may be elements constituting a program module executed by the control unit 110. The program module may be recorded in the storing unit 120 in advance and then executed by the control unit 110. One component may be integrated with another component. In addition, one component may be divided into two or more subcomponents. Data generated by one component may be stored in the storing unit 120 and then referred to by another component even through not stated otherwise.

The current value sampling unit 111 samples the first current value measured through the first current sensor 12*a* and the second current value measured through the second current sensor 12*b* at each of a plurality of preset sampling time points, at the same timing, and sends the first current value and the second current value sampled at the same timing to the first determining unit 112. In an embodiment of the present disclosure, the sampling frequency of the first and second current values may be set as N in advance.

In another embodiment of the present disclosure, the current value sampling unit 111 may set the sampling frequency of the first and second current values as N in advance, and the current value sampling unit 111 sends an M number of recently sampled first and second current values among the N number of sampled first and second current values to the first determining unit 112. Here, M may be smaller than N.

To this end, the current value sampling unit 111 may store a sampling number to be matched with the first and second current values.

Through this, in another embodiment of the present disclosure, the current value sampling unit 111 may improve the accuracy of determination by sending recently sampled first and second current values to the first determining unit 112.

In another embodiment, the current value sampling unit 111 may be set the sampling frequency of the first and second current values as N in advance, and may send first and second current values sampled from a time point just before the first and second current values are sent to the first determining unit 112 to a time point before the preset reference time to the first determining unit 112.

In another embodiment, even if an M number of first and second current values are sampled, the current value sampling unit 111 may send first and second current values sampled during a recent reference time to the first determining unit 112.

To this end, the current value sampling unit 111 may store a sampling time of the time point for sampling the first and second current values to be matched with the first and second current values.

Whenever the first determining unit 112 receives the first current value and the second current value sampled at the same timing, the first determining unit 112 determines whether a difference value between the two current values is greater than a predetermined reference value. For example, the first determining unit 112 may determine whether the difference value between the first current value and the second current value sampled at the same timing is greater than a predetermined reference value, for example 17 [A]. The reference value is just an example and may be changed to any other value.

If the difference value between the first current value and the second current value is not greater than the reference value 17 [A], as in Equation 1 below, the first determining unit 112 may provisionally determine that the first current sensor 12a and the second current sensor 12b are in a normal state.

|first current value−second current value|≤17 [A]    [Equation 1]

Meanwhile, if the difference value between the first current value and the second current value is greater than the reference value 17 [A] as in Equation 2 below, the first determining unit 112 may provisionally determine that at least one of the first current sensor 12a and the second current sensor 12b is in an error state.

|first current value−second current value|>17 [A]    [Equation 2]

Preferably, the first determining unit 112 sends the error occurrence determination result of the current sensor to the frequency calculating unit 113 over N times.

Figure 5:
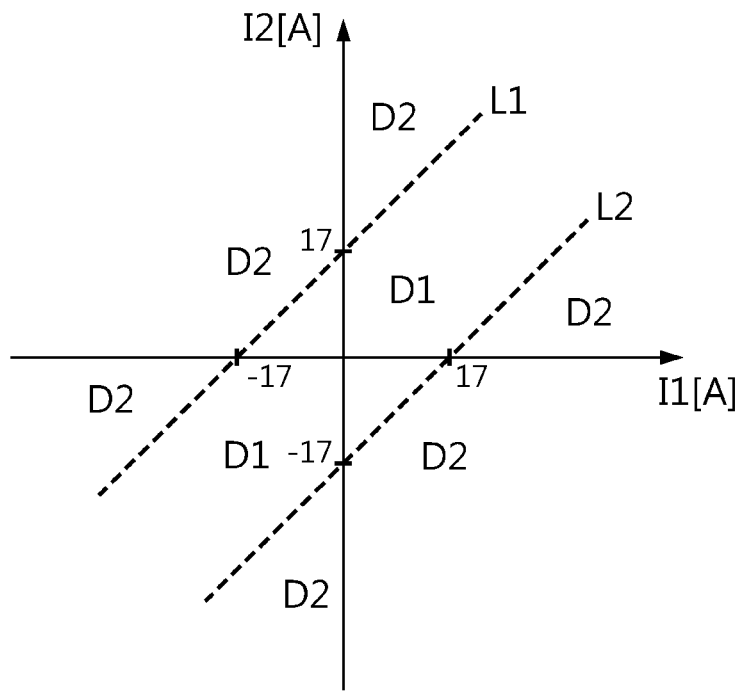
FIG. 5 is a diagram showing current value ranges determined as a normal state and an error state in an orthogonal coordinate system, when a provisional error is determined according to a current difference value between two current sensors.

FIG. 5 is a diagram showing current value ranges determined as a normal state and an error state in an orthogonal coordinate system, when a provisional error is determined according to a current difference value between two current sensors.

In the orthogonal coordinate system of FIG. 5, an X axis represents the first current value and a Y axis represents the second current value. A positive value is assigned to the current value measured when the secondary battery cell 20 is being charged, and a negative value is assigned to the current value measured when the secondary battery cell 20 is being discharged.

Referring to FIG. 5, if the difference value between the first current value and the second current value is not greater than the reference value 17 [A], namely if points obtained by putting the first current value and the second current value sampled at the same timing into X and Y coordinates, respectively, belong to a region D1 between a dotted line L1 and a dotted line L2, it may be provisionally determined that the first current sensor 12a and the second current sensor 12b are in a normal state.

From the theoretical point of view, since the first current sensor 12a and the second current sensor 12b measure the same current, the first current sensor 12a and the second current sensor 12b may be determined as being in a normal state only when the points indicating the first current value and the second current value are located on a straight line having a slope of 1. However, if the points corresponding to the first current value and the second current value belong to the region D1, the corresponding current sensors 12a, 12b may be determined to be in a normal state in consideration of tolerances of the current sensors or the like.

Meanwhile, in the first determining unit 112, if the difference value between the first current value and the second current value is greater than the reference value 17 [A], namely if the points corresponding to the first current value and the second current value are located in a region D2 out of the dotted line L1 and the dotted line L2, it may be provisionally determined that at least one of the first current sensor 12a and the second current sensor 12b is in an error state.

Referring to FIG. 4 again, the frequency calculating unit 113 receives the determination results of the first determining unit 112 sequentially over N times, integrates the number of times that the difference value between the first voltage value and the second voltage value is not greater than the reference value to calculate a first frequency, and integrates the number of times that the difference value is greater than the reference value to calculate a second frequency. In this case, the first frequency may refer to the number of times at which the state is provisionally determined as a normal state and the second frequency may refer to the number of times at which the state is provisionally determined as an error state. If the first frequency and the second frequency are completely integrated over N times, the frequency calculating unit 113 sends the first frequency and the second frequency to the second determining unit 114.

Meanwhile, in another embodiment, the first determining unit 112 may determine whether the sampling number matched with the sent first and second voltage values is equal to or smaller than the sampling number matched with the first and second voltage values sent from the current value sampling unit 111 before, and then the first determining unit 112 may request the current value sampling unit 111 to send first and second voltage values again if the sampling number matched with the sent first and second voltage values is equal to or smaller than the sampling number matched with the first and second voltage values sent from the current value sampling unit 111 before.

In another embodiment, the first determining unit 112 may determine whether the sampling time matched to the sent first and second voltage values is earlier than the sampling time matched with the first and second voltage values sent from the current value sampling unit 111 before, and then, the first determining unit 112 may request the current value sampling unit 111 to send the first and second voltage values again if the sampling time matched to the sent first and second voltage values is earlier than the sampling time matched with the first and second voltage values sent from the current value sampling unit 111 before.

In this way, the first determining unit 112 may receive the recently sampled first and second voltage values without being duplicated with the first and second voltage values received before.

If the first frequency and the second frequency are received from the first determining unit 112, the second determining unit 114 calculates an error determination ratio corresponding to a ratio of the first frequency to the sum of the first frequency and the second frequency, and compares the calculated error determination ratio with a predetermined reference ratio to determine whether an error occurs in the current sensor.

The second determining unit 114 may calculate the error determination ratio (R) as in Equation 3 below.

$$R[\%]=[\text{first frequency}\div(\text{first frequency}+\text{second frequency})]\times 100 \quad \text{[Equation 3]}$$

If the error determination ratio R is equal to or greater than the reference ratio, the second determining unit 114 determines that no error occurs in the first current sensor 12a and the second current sensor 12b. Meanwhile, if the error determination ratio (R) is smaller than the reference ratio, the second determining unit 114 determines that an error occurs in at least one of the first current sensor 12a and the second current sensor 12b. For example, the second determining unit 114 may determine that no error occurs in the first current sensor 12a and the second current sensor 12b if the error determination ratio (R) is 95% or more, and may determine that an error occurs in any one of the first current sensor 12a and the second current sensor 12b if the reference ratio is smaller than 95%. Preferably, the second determining unit 114 sends the error determination information about the current sensor to the error information processing unit 115.

The error information processing unit 115 may receive the determination result about whether an error occurs in the current sensor from the control unit 110. Specifically, if the error determination information received from the second determining unit 114 indicates that an error occurs in the current sensor, the error information processing unit 115 generates a DTC (Diagnostic Trouble Code) indicating the current sensor error and stores the DTC in the storing unit 120. The DTC refers to a unique code showing each system error. The DTC stored in the storing unit 120 may be sent to an external device through the communication unit 140.

That is, the error information processing unit 115 may generate and store the DTC indicating a current sensor error in the storing unit 120 and send error information indicating that an error occurs in the current sensor to an external device together with the DTC through the communication unit 140. In this case, the external device may be a device for reading the diagnosis result of the current sensor, or may be an ECU that manages the overall operation of a battery device of a vehicle if the secondary battery cell 20 is mounted to an electric vehicle or a hybrid electric vehicle.

In an embodiment, the error information processing unit 115 may output the error information indicating that an error occurs in the current sensor through the output unit 130 as visual information. In this case, the output unit 130 may turn on an LED light or output an error occurrence notification message through a display unit.

In addition, if the error determination information received from the second determining unit 114 indicates that an error occurs in the current sensor, the error information processing unit 115 may send an SOC estimation stop request to the SOC estimating unit 18. The SOC estimating unit 18 receiving the stop request may stop the SOC estimation and send a stop completion signal to the control unit 110 or to a superior control system of the BMS 10 through a communication interface.

Meanwhile, after the first frequency and the second frequency integrated over N times are sent to the second determining unit 114, the frequency calculating unit 113 resets the first frequency and the second frequency to 0. In addition, if a periodic next diagnostic time point arrives, the current value sampling unit 111 repeats sampling current values for the first current sensor 12a and the second current sensor 12b.

Figure 6:
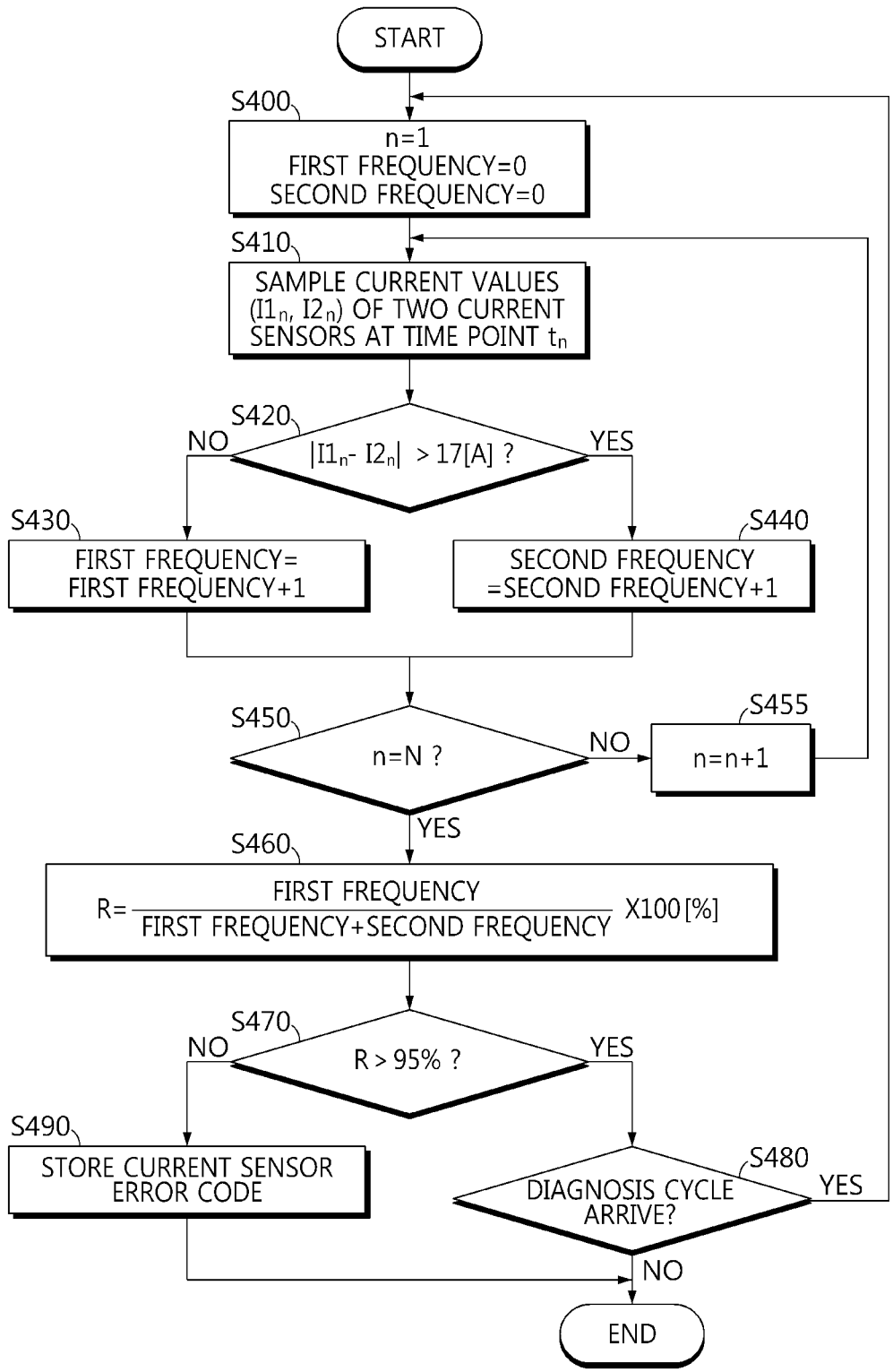
FIG. 6 is a diagram schematically showing a current sensor diagnosing method according to another embodiment of the present disclosure.

FIG. 6 is a flowchart showing a current sensor diagnosing method according to another embodiment of the present disclosure. Here, the current sensor diagnosing method is a method of diagnosing an error of a plurality of current sensors configured to measure a current of a secondary battery cell and may be executed by the current sensor diagnosing apparatus 100.

Hereinafter, the operations performed by the current sensor diagnosing apparatus 100 will be described in time series with reference to FIG. 6.

Referring to FIG. 6, the control unit 110 of the current sensor diagnosing apparatus 100 receives current values of the first current sensor 12a and the second current sensor 12b configured to measure a current value of the same current at regular time points and determines whether an error occurs in the first current sensor 12a and the second current sensor 12b by using the received current values.

As initial values before sampling the current values is started, the control unit 110 may set the sampling frequency (n) to 1 and set the first frequency and the second frequency to 0, respectively.

The current value sampling unit 111 of the control unit 110 samples a first current value (I1n) measured through the first current sensor 12a and a second current value (I2n) measured through the second current sensor 12b at the same timing, and sends the first and second current values (I1n, I2n) sampled at the same timing to the first determining unit 112, at each of a plurality of predetermined sampling time points (tn) (S410).

Next, the first determining unit 112 of the control unit 110 determines whether a difference value, |I1n-I2n|, between the two current values is greater than a predetermined reference value, for example 17 [A], for the first current value and the second current value sampled at the same timing (S420).

If the difference value |I1n-I2n| between the first current value and the second current value is not greater than the reference value 17 [A], the first determining unit 112 of the control unit 110 provisionally determines that the first current sensor 12a and the second current sensor 12b are in a normal state and sends the determination result to the frequency calculating unit 113.

If so, the frequency calculating unit 113 of the control unit 110 calculates the first frequency cumulatively by adding 1 to the first frequency indicating the number of times at which the first current sensor 12a and the second current sensor 12b are determined to be in a normal state, and stores the same in the storing unit 120 (S430).

Meanwhile, if the difference value |I1n-I2n| between the first current value and the second current value is greater than the reference value 17 [A], the first determining unit 112 of the control unit 110 provisionally determines that at least one of the first current sensor 12a and the second current sensor 12b is in an error state, and sends the determination result to the frequency calculating unit 113.

Then, the frequency calculating unit 113 of the control unit 110 calculates the second frequency cumulatively by adding 1 to the second frequency indicating the number of times at which the first current sensor 12a and the second current sensor 12b are determined as in an error state, and stores the second frequency in the storing unit 120 (S440).

The control unit 110 repeats the above processes (S410 to S440) by a predetermined sampling frequency (N) (S450, S455).

If the first frequency and the second frequency are cumulatively calculated for the error diagnosis results of the current sensor over N times, the frequency calculating unit 113 sends the cumulatively calculated first and second frequencies to the second determining unit 114 of the control unit 110.

The second determining unit 114 of the control unit 110 calculates an error determination ratio (R) corresponding to a ratio of the first frequency to the sum of the first frequency and the second frequency as in Equation 3 (S460), and compares the calculated error determination ratio (R) with a predetermined reference ratio, for example 95%, to determine whether an error occurs in the current sensor (S470).

If the calculated error determination ratio R is greater than or equal to 95%, the second determining unit 114 finally determines that no error occurs in the first current sensor 12a and the second current sensor 12b. In addition, if a predetermined next diagnosis cycle arrives, the control unit 110 may repeat the above processes (S400 to S470) (S480). The frequency calculating unit 113 of the control unit 110 resets the first frequency and the second frequency to 0 (zero) after sending the first and second frequencies accumulated over N times to the second determining unit 114. If a predetermined next diagnosis cycle arrives, the current value sampling unit 111 of the control unit 110 resumes sampling of the current value for the first current sensor 12a and the second current sensor 12b.

Meanwhile, if the calculated error determination ratio (R) is smaller than the reference ratio 95%, the second determining unit 114 determines that an error occurs in any one of the first current sensor 12a and the second current sensor 12b, and sends the error diagnostic information to the error information processing unit 115.

If so, the error information processing unit 115 of the control unit 110 generates a DTC (Diagnostic Trouble Code) indicating the current sensor error and stores the DTC in the storing unit 120 (S490).

Optionally, after generating the DTC indicating a current sensor error and storing the DTC in the storing unit 120, the error information processing unit 115 may send error information indicating that an error occurs in the current sensor to an external device along with the DTC through the communication unit 140.

In an embodiment, the error information processing unit 115 may output the error information indicating that an error occurs in the current sensor through the output unit 130 as visual information. In this case, the output unit 130 may turn on an LED light or output an error occurrence notification message through a display unit.

In addition, if the error diagnosis information of the current sensor received from the second determining unit 114 indicates that an error occurs in the current sensor, the error information processing unit 115 may send an SOC estimation stop request to the SOC estimating unit 18. The SOC estimating unit 18 receiving the stop request may stop the SOC estimation and send a stop completion signal to the control unit 110 or to a superior control system of the BMS 10 through a communication interface.

In the present disclosure, the control unit 110 may optionally include processors, application-specific integrated circuits (ASICs), other chipsets, logic circuits, registers, communication modems, data processing devices, and the like, known in the art to implement the various control logics described above. In addition, when the control logics are implemented in software, the control unit 110 may be implemented as a set of program modules. In this case, the program module may be stored in a memory and executed by a processor. The memory may be provided in or out of the processor and may be coupled to the processor through various computer components well known in the art. Also, the memory may be included in the storing unit 120 of the present disclosure. In addition, the memory is a general term of a device in which information is stored regardless of the type of device, and does not refer to a specific memory device.

In addition, one or more control logics of the control unit 110 may be combined, and the combined control logic may be written in a computer-readable code system and recorded in a computer-readable recording medium. The recording medium is not specially limited as long as so that it is accessible by a processor included in the computer. As one example, the recording medium includes at least one selected from the group consisting of a ROM, a RAM, an EEPROM, a register, a flash memory, a CD-ROM, a magnetic tape, a hard disk, a floppy disk and an optical data recording device. In addition, the code system may be stored and executed in a distributed manner on computers connected through a network. Moreover, functional programs, code and code segments for implementing the combined control logics may be easily inferred by programmers in the technical field to which the present disclosure belongs.

In the present disclosure, the secondary battery cell may indicate one unit cell or an aggregate of unit cells in which a plurality of unit cells are connected in series and/or in parallel. The aggregate of unit cells may be referred to as a battery module or a battery pack, and the present disclosure is not limited by the number of unit cell connections or the connection method thereof.

As described above, according to the present disclosure, since an error of current sensors are diagnosed using a offset deviation and a current value of the two current sensors, it is possible to diagnose an error of current sensors in the same way regardless of the type of a system using the current sensor, the type of the current source or voltage characteristics, or the like. In particular, the present disclosure may be easily applied to various systems including two current sensors.

In addition, the current sensor diagnosing apparatus may determine an average value of current values measured by the two current sensors as a measured current value, and at the same time may reliably diagnose an error of the current sensors.

In addition, since current values measured by two current sensors at the same time are compared with each other to determine whether an error occurs in the current sensors, it is possible to accurately diagnose not only an error when the current sensors do not operate at all but also errors when a measurement error occurs in the current value due to a decrease in response speed of the current sensor, a phase delay, or the like.

In addition, in the present disclosure, determination results are accumulated by repeatedly determining whether an error occurs in the current sensors on the basis of a difference value between the current values actually measured by the two current sensors, a frequency for each determination result is calculated through the accumulated determination results, and it is finally determined again probabilistically whether an error occurs on the basis of the frequency for each determination result. Thus, the present disclosure is robust to instantaneous current or frequency change and may improve the accuracy and reliability of error diagnosis.

In addition, the present disclosure may fundamentally prevent a phenomenon of erroneously diagnosing that an error occurs in the current sensors as a difference is generated between measured current values according to a difference in cutoff frequencies between the current sensors when a high frequency current is input.

The embodiments according to the present disclosure, of course, may solve various technical problems other than the above objects in the technical field as well as the related technical field.

In describing various embodiments of the present disclosure, components named ' . . . unit' should be understood as functionally distinct elements rather than physically distinct elements. Thus, each component may be selectively integrated with other components or each component may be divided into subcomponents for efficient execution of control logic(s). It is apparent to those skilled in the art that if the functional identity of the components can be recognized even though the components are integrated or divided, the integrated or divided components should also be interpreted as being within the range of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

10: BMS
12a: first current sensor
12b: second current sensor
14: voltage sensor
16: temperature sensor
18: SOC estimating unit
20: secondary battery cell
21: main relay
30: charging unit
100: current sensor diagnosing apparatus
110: control unit
111: current value sampling unit
112: first determining unit
113: frequency calculating unit
114: second determining unit
115: error information processing unit
120: storing unit
130: output unit
140: communication unit

What is claimed is:

1. An apparatus for diagnosing an error of a plurality of current sensors connected to a secondary battery cell, comprising:

a control unit configured to:
for each charging and discharging cycle of the secondary battery cell, receive a first current value measured by a first current sensor and a second current value measured by a second current sensor at a same time point during the charging and discharging cycle;
measure a driving offset of the first current sensor whenever the first current sensor measures the first current value, measure a driving offset of the second current sensor whenever the second current sensor measures the second current value;
measure a first wake-up offset of the first current sensor and a second wake-up offset of the second current sensor before charging and discharging of the secondary battery cell are performed in a present charging and discharging cycle;
compare the first driving offset of the first current sensor and the second driving offset of the second current sensor measured in a previous charging and discharging cycle with the first wake-up offset and the second wake-up offset measured in the present charging and discharging cycle, respectively; and
diagnose, based on the comparison result, whether an error occurs in at least one of the first current sensor or the second current sensor.

2. The apparatus according to claim 1,
wherein the control unit is configured to:
select a last driving offset of the first current sensor measured in the previous charging and discharging cycle as the first driving offset measured in the previous charging and discharging cycle; and
select a last driving offset of the second current sensor measured in the previous charging and discharging cycle as the second driving offset measured in the previous charging and discharging cycle.

3. The apparatus according to claim 2, further comprising:
memory configured to store a plurality of driving offsets of the first current sensor and a plurality of driving offsets of the second current sensor according to a measurement order for each charging and discharging cycle,
wherein the control unit is configured to select a driving offset stored last among the plurality of driving offsets of the first current sensor stored in the storing unit as the first driving offset measured in the previous charging and discharging cycle and select a driving offset stored last among the plurality of driving offsets of the second current sensor stored in the storing unit as the second driving offset measured in the previous charging and discharging cycle.

4. The apparatus according to claim 1,
wherein when it is determined that an error occurs in at least one of the first current sensor and the second current sensor, the control unit is configured to control an operation state of a main relay connected to the secondary battery cell to an off state so that charging and discharging of the secondary battery cell are not performed in the present charging and discharging cycle.

5. The apparatus according to claim 4,
wherein the control unit is configured to:
calculate a first offset deviation between the first driving offset measured in the previous charging and discharging cycle and the first wake-up offset measured in the current charging and discharging cycle, and a second offset deviation between the second driving offset measured in the previous charging and discharging cycle and the second wake-up offset measured in the current charging and discharging cycle; and control the operation state of the main relay to the off state when at least one of the calculated first offset deviation or the calculated second offset deviation is equal to or greater than a preset reference deviation.

6. The apparatus according to claim 4, wherein the control unit is configured to control the operation state of the main relay to the off state when at least one of the first current value or the second current value is equal to or greater than a preset threshold current.

7. The apparatus according to claim 1, wherein the control unit includes:

a current value sampling unit configured to sample the first current value and the second current value at a same time, at each of a plurality of predetermined sampling time points;

a first determining unit configured to determine whether a difference value between the first current value and the second current value sampled at the same time is greater than a predetermined reference current value;

a frequency calculating unit configured to:

calculate a first frequency by integrating a total number of times at which the difference value is determined not to be greater than the reference current value; and calculate a second frequency by integrating a total number of times at which the difference value is determined to be greater than the reference current value; and a second determining unit configured to:

calculate an error determination ratio corresponding to a ratio of the first frequency to a sum of the first frequency and the second frequency; and determine whether an error occurs by comparing the calculated error determination ratio with a predetermined reference ratio.

8. The apparatus according to claim 7, wherein the second determining unit is configured to:

determine that an error does not occur in the first current sensor and the second current sensor when the calculated error determination ratio is equal to or greater than the reference ratio, and determine that an error occurs in at least one of the first current sensor or the second current sensor when the calculated error determination ratio is smaller than the reference ratio.

9. The apparatus according to claim 8, wherein when the second determining unit determines that an error occurs in at least one of the first current sensor or the second current sensor, the control unit is configured to control an operation state of a main relay connected to the secondary battery cell to an off state so that charging and discharging of the secondary battery cell are not performed in the present charging and discharging cycle.

10. The apparatus according to claim 7, wherein the current value sampling unit is configured to send to the first determining unit a first previous current value and a second previous current value sampled a preset reference amount of time before sending the first current value and the second current value to the first determining unit.

11. A battery management system, comprising the apparatus according to claim 1.

12. The battery management system according to claim 11, further comprising:

a State Of Charge (SOC) estimating unit configured to estimate a SOC of the secondary battery cell on the basis of the current values measured through the first current sensor or the second current sensor; and an error information processing unit configured to send a SOC estimation stop request to the SOC estimating unit, in response to a determination by the control unit that an error occurs in at least one of the first current sensor or the second current sensor.

13. A battery pack, comprising the apparatus according to claim 1.

* * * * *